(12) United States Patent
Buter et al.

(10) Patent No.: US 8,362,939 B2
(45) Date of Patent: Jan. 29, 2013

(54) SWITCHED-CAPACITOR PIPELINE ADC STAGE

(75) Inventors: Berry Anthony Johannus Buter, Veldhoven (NL); Hans Van De Vel, Geel (BE)

(73) Assignee: Integrated Device Technology, Inc., San Jose, CA (US)

( * ) Notice: Subject to any disclaimer, the term of this patent is extended or adjusted under 35 U.S.C. 154(b) by 141 days.

(21) Appl. No.: 12/999,567

(22) PCT Filed: Jun. 11, 2009

(86) PCT No.: PCT/IB2009/052492
§ 371 (c)(1),
(2), (4) Date: Dec. 31, 2010

(87) PCT Pub. No.: WO2010/004455
PCT Pub. Date: Jan. 14, 2010

(65) Prior Publication Data
US 2011/0095930 A1   Apr. 28, 2011

(30) Foreign Application Priority Data
Jun. 16, 2008  (EP) ..................................... 08104426

(51) Int. Cl.
*H03M 1/38*  (2006.01)
(52) U.S. Cl. ........ 341/161; 327/307; 327/311; 327/103; 327/552; 327/554; 324/662; 324/686; 455/130; 330/252
(58) Field of Classification Search .......... 341/155–172; 455/130; 35/149; 324/662, 663, 679, 686; 382/124; 327/552, 554, 103, 94, 307, 311; 330/9, 252

See application file for complete search history.

(56) References Cited

U.S. PATENT DOCUMENTS

| | | | |
|---|---|---|---|
| 4,982,194 A * | 1/1991 | Bacrania et al. | 341/172 |
| 5,467,460 A | 11/1995 | Patel | |
| 5,563,405 A * | 10/1996 | Woolaway et al. | 250/208.1 |
| 5,802,559 A | 9/1998 | Bailey | |
| 5,874,842 A | 2/1999 | Masuta | |
| 5,903,043 A * | 5/1999 | Ichikawa et al. | 257/532 |
| 6,031,480 A | 2/2000 | Soenen et al. | |
| 6,427,184 B1 | 7/2002 | Kaneko et al. | |
| 6,583,747 B1 * | 6/2003 | van der Goes et al. | 341/156 |
| 6,617,908 B1 | 9/2003 | Thomsen et al. | |
| 6,956,519 B1 * | 10/2005 | Huang et al. | 341/172 |
| 7,075,316 B2 * | 7/2006 | Umeda et al. | 324/658 |
| 7,084,645 B1 * | 8/2006 | Umeda et al. | 324/686 |

(Continued)

FOREIGN PATENT DOCUMENTS

JP    2004-222018 A    8/2004

OTHER PUBLICATIONS

International Search Report and Written Opinion for Int'l. patent appln. No. PCT/IB2009/052463 (Sep. 22, 2009).

(Continued)

*Primary Examiner* — Lam T Mai
(74) *Attorney, Agent, or Firm* — Hayes and Boone LLP

(57) ABSTRACT

A switched capacitor pipeline ADC stage is disclosed, in which a reset switch is included to reset the sampling capacitor during a first part of the sampling period. The reset switch thereby removes history and makes the sampling essentially independent of previous samples taken, thus reducing inter symbol interference (IS) and distortion resulting therefrom, without significantly affecting the sampling period or power usage of the device.

13 Claims, 8 Drawing Sheets

U.S. PATENT DOCUMENTS

| | | |
|---|---|---|
| 7,265,705 B1 | 9/2007 | Lee et al. |
| 7,304,598 B1 | 12/2007 | Bogner |
| 7,633,423 B2 * | 12/2009 | Cho .............................. 341/161 |
| 7,755,364 B2 * | 7/2010 | Childs ........................... 324/501 |
| 8,067,972 B2 * | 11/2011 | Iida et al. ...................... 327/337 |
| 8,222,944 B2 * | 7/2012 | Lee et al. ...................... 327/307 |
| 2002/0171655 A1 | 11/2002 | Lavelle et al. |
| 2004/0032359 A1 | 2/2004 | Lebedev |
| 2004/0239378 A1 | 12/2004 | Bogner |
| 2005/0144387 A1 | 6/2005 | Adl-Tabatabai et al. |
| 2006/0038712 A1 | 2/2006 | Harrison et al. |
| 2007/0090987 A1 | 4/2007 | Cho et al. |
| 2007/0247348 A1 | 10/2007 | Razayee et al. |

OTHER PUBLICATIONS

Lewis, S. H., et al., "A Pipelined 5-Msample/s 9-bit Analog-to-Digital Converter", IEEE Journal of Solid-State Circuits, vol. SC22, No. 6, 8 pages, Dec. 1987.

Lewis, S. H., et al., "A 10-b 20-Msample/s Analog-to-Digital Converter", IEEE Journal of Solid-State Circuits, vol. 27, No. 3, 8 pages, Mar. 1992.

Bogner, P., et al., "A 14b 100MS/s Digitally Self-Calibrated Pipelined ADC in 0.13μm CMOS", ISSCC 2006/Session 12/NYQuist ADCs/12.6, 10 Pages, 2006.

International Search Report for Application No. PCT/IB2009/052492 dated Dec. 29, 2009.

* cited by examiner

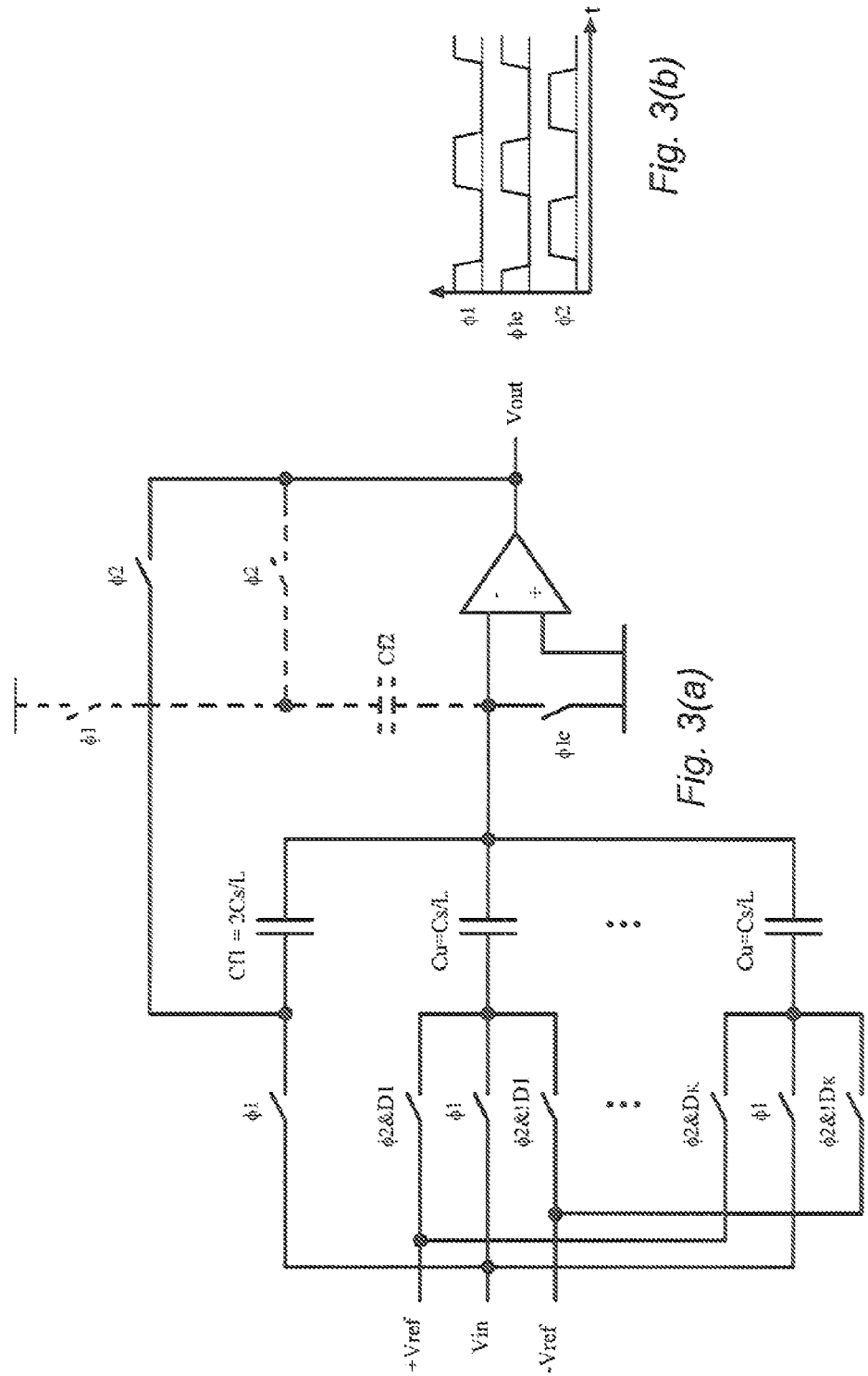

SWITCHED-CAPACITOR PIPELINE ADC STAGE

FIELD OF THE INVENTION

This invention relates to analogue-to-digital converters (ADC), and more particularly to pipeline ADC stages.

BACKGROUND OF THE INVENTION

ADCs are used in a wide range of electrical and electronic equipment, in fields as diverse as sensing and instrumentation, audio and video devices, and communications equipment.

The performance requirements of ADCs vary according to the application, but in general, it is important that ADCs are both linear, that is to say, the change in digital output is proportional to a change in analog input, and repeatably accurate, that is to say, the ADC output should be the same for the same inputs and provide a proper representation of the input.

For many applications, the speed of the ADC conversion is important. For instance, ADCs used for the conversion of analog video signals into a digital signal may require fast operation: to support a frame rate of 10 s or 100 s of hertz, the ADC may be required to sample and convert the signal at a rate of 10 s or 100 s of MegaHertz.

One convenient and commonly used design of ADC, which is capable of operating at high speeds, is the so-called pipeline design of ADC. In a pipeline ADC, the conversion of the sampled analog signal occurs over several stages. At each stage, a simple conversion of the analog signal is made to extract typically one, or one and a half, "bits" of the digital signal. This digital signal is reconverted into an analog equivalent, and subtracted from the analog input to the stage, resulting in a residue (analog) signal. This residual signal is amplified and passed to the next stage, in which the same operation is carried out. The resulting (second) residue is passed to a third stage, and so on.

Thus, in a pipeline ADC, the analog signal passes along a conceptual "pipeline", and as it passes along the pipeline, it is sequentially and progressively converted to a digital signal, starting with the most significant bit, and concluding with the least significant bit.

An example architecture of a pipeline ADC is shown schematically in FIG. 1. The first block 1 is a dedicated sample-and-hold (SH) that samples the input signal and buffers it to drive the following stages. Each of the pipeline stages after the front-end SH 1 resolve a number of bits. A pipeline stage, "stage i", 2, consists of a SH 3 to sample the input from a previous stage. An ADC 4 quantizes the held sample and the digital output obtained is converted back to the analog domain, at a Digital-to-Analog Converter (DAC) 5 and subtracted from the held sample at adder 6. The residue signal obtained after the subtraction point is amplified by amplifier 7 and fed to the next stage. The functionality contained inside the pipeline stages can be implemented with a switched-capacitor circuit. In the last stage 8 (stage k) only the residue of the previous stage needs to be quantized and this functionality is implemented with only an ADC. The bits from the different stages are combined in the digital domain to form the final output word of the pipeline ADC.

As shown in FIG. 1 the stage after the first block also contains a SH. To save power the dedicated SH in the first block can be omitted and its functionality can be taken over by the SH in the first intermediate stage. Doing so makes the design of the first pipeline stage more complicated because of the increased demands.

The basic architecture of a switched-capacitor implementation of a pipeline stage without the need of a dedicated front-end SH is shown in FIG. 2(a). Switches φ1 (which comprises separate switches φ1 and φ1e) and φ2 are alternately high. During the time φ1 (which comprises separate switches φ1 and φ1e in FIG. 2(a)) is high the voltage on capacitor Cs tracks the input and capacitor Cf is discharged. On the falling edge of φ1 the instantaneous voltage on capacitor Cs is sampled and the ADC 21 is strobed to quantize the input.

In a practical implementation the timing of the component switches of φ1, that is to say, switches φ1 and φ1e, is adjusted such that φ1e leads φ1, as shown in FIG. 2(b). FIG. 2(b) shows that both clock signals φ1 and φ1e are non-overlapping high with clock signal φ2 (that is to say, closed). Clock signal φ1e is a slightly advanced version of clock signal φ1. During the time φ1 and φ1e are high the voltage on capacitor Cs tracks the input and capacitor Cf is discharged. It is on the falling edge of φ1e (which is ahead of φ1) that the instantaneous voltage on capacitor Cs is sampled and the ADC 21 is strobed to quantize the input. The advanced clock φ1e ensures that the critical sample moment is determined by switch φ1e. This is commonly referred to as bottom-plate sampling.

The DAC 22 outputs an analog signal representing the quantized result of the ADC. During the time that φ2 is high the operational amplifier 23 ("opamp") maintains virtual ground at the negative input, assuming it has sufficient open-loop gain, and capacitor Cs is charged to the DAC output voltage. Thereby an amount of charge is transferred to capacitor Cf. This amount of charge $Q_\Delta$ is equal to $Q_q-Q_s$, where the charge $Q_q$ is $C_s V_{DAC}$ and charge $Q_s$ is $CsV_{in}(t_s)$. The residue output voltage then becomes (equation 1):

$$V = -Q_\Delta/Cf = Cs/Cf \cdot (V_{in}(t_s) - V_{DAC})$$

The next period, when φ1 and φ1e are high again, capacitor Cs is connected to the input again to track the input and take a new sample on the falling edge of φ1e.

The signal on capacitor Cs at the start of the track period is correlated to a previous input sample which introduces inter-symbol interference (ISI). This ISI can cause distortion when the settling is non linear or the signal on Cs has a non-linear correlation with the previous sample. For the pipeline stage shown in FIG. 2 the signal on Cs is a quantized representation of the previous sample at the start of the track period. Since quantizing a signal is a non-linear operation this pipeline stage introduces distortion regardless whether the settling toward a new sample is linear.

One problem which is associated with switched-capacitor pipeline stages without dedicated SH is that the charge on the sample capacitor at the beginning of the track period, and the voltage corresponding to this charge, is correlated to a previous input sample. This results in ISI. This ISI can cause distortion when the settling is non linear or the signal on the sample capacitor has a non-linear correlation with the previous sample.

It is known from P. Bognor et al. "A 14b 100 MS/s Digitally Self-Calibrated Pipelined ADC in 0.13 m CMOS". In *ISSCC Digest of Technical Papers*, 2006, to compensate the charge on the sample capacitor by an opposite charge sampled on a dummy capacitor. The opposite charges cancel each other and ISI, which would otherwise result in distortion, is avoided in this way. This idea is also disclosed in US patent application US2004-0239378A1. The sample and hold phases are carried out immediately after each other, and a separate reset phase before the sample phase is not necessitated. However, one disadvantage of this arrangement is that the capacitive load of the input driver and reference buffers is doubled thereby resulting in an increase in the device's power dissipation.

There thus remains a need for a switched-capacitor pipeline ADC stage, which provides a reduction in inter-symbol interference, without significantly increasing power dissipation.

SUMMARY OF THE INVENTION

It is an object of the present invention to provide a switched capacitor pipeline stage, which does not suffer to the same extent from ISI or the above disadvantage.

According to the present invention there is provided A switched-capacitor pipeline ADC stage comprising an input stage comprising a quantising ADC and a DAC, a sampling capacitor having an input electrode which is switchably connectable to each of an input to the ADC stage and an output of the DAC, and an output stage, connected to an output electrode of the sampling capacitor and for determining the difference between a signal at the DAC output and a signal at the ADC input, characterized in that the ADC stage further comprises a reset switch connected to the sampling capacitor and being for resetting the charge in the sampling capacitor, and is arranged to be closed, in use, for a predetermined period immediately prior to a connecting of the input electrode to the input to the quantising ADC. Since the input of the quantising ADC is at the input to the pipeline stage, when the input electrode is connected to the input of the quantising ADC, it is also connected to the input of the pipeline stage.

Preferably, the output stage comprises transfer capacitance means connected between a first input of an operational amplifier and an output of the operational amplifier.

Advantageously, the transfer capacitance means may be arranged to be discharged when the input electrode is connected to the input to the quantising ADC. Alternatively or additionally, the transfer capacitance means may be arranged to be discharged when the reset switch is closed. Thus the stage can work efficiently, using a minimum of clock signals.

Preferably the ADC stage comprises a MDAC stage wherein the sampling capacitor comprises a part of the transfer capacitance means, and the sampling capacitor comprises a plurality of individual capacitors having a common output electrode and each having an individual input electrode which input electrodes together comprise the input electrode, the individual input electrodes being individually switchably connectable to either one of two reference voltages, and being switchably connectable to the input to the ADC stage, and wherein the reset switch is arranged to be closed, in use, for the predetermined period immediately prior to the connecting of the individual input electrodes to the input to the quantising ADC.

Preferably, the two reference voltages are equal in magnitude and opposite in sign. However, the reference voltage may include a common offset, or not be symmetrically arranged around zero, for other reasons such as not having a local ground available.

According to another aspect of the invention, there is provided a switched-capacitor pipeline ADC stage comprising an input stage comprising a quantising ADC having differential inputs and a DAC having differential outputs, first and second sampling capacitors each having a respective input electrode which is switchably connectable to a respective differential input to the ADC stage and the respective differential output of the DAC, and an output stage, comprising a differential amplifier having differential inputs connected respectively to an output electrode of each of the first and second sampling capacitors, characterized in that the ADC stage further comprises a reset switch connected between the respective first and second sampling capacitors and being for balancing the charge between the sampling capacitors, and being arranged to be closed, in use, for a predetermined period immediately prior to connecting of the input electrodes to the respective differential input to the quantising ADC.

Preferably, the output stage comprises a first transfer capacitance means connected between a first input of an operational amplifier and an inverting output of the operational amplifier, and a second transfer capacitance means connected between a second input of the operational amplifier and a non-inverting output of the operational amplifier.

Advantageously, the transfer capacitance means may be arranged such that respective charges on them are either discharged or made to balance when the input electrodes are connected to the respective differential input to the quantising ADC. Alternatively or additionally, the transfer capacitance means may be arranged such that respective charges on them are either discharged or made to balance when the reset switch is closed.

Alternatively, the reset switch is arranged such that the respective input electrodes of the first and second sampling capacitors are connected to ground when the reset switch is closed.

Advantageously, the ADC stage may comprise an MDAC stage wherein the sampling capacitors comprise a part of the transfer capacitance means, and the each sampling capacitor may comprise a plurality of individual capacitors having a common output electrode and each having an individual input electrode which input electrodes together comprise the respective sampling capacitor's input electrode, the individual input electrodes being individually switchably connectable to either one of two reference voltages, and being switchably connectable to the respective input to the ADC stage and wherein the reset switch is arranged to be closed, in use, for the predetermined period immediately prior to the connecting of the individual input electrodes to the respective differential input to the quantising ADC stage.

Preferably, the differential outputs of the DAC have respective voltages which are equal in magnitude and opposite in sign.

According to another aspect of the invention, there is provided an ADC comprising one or a plurality of such ADC stages. Thus the invention is not limited to a single stage, but can encompass an ADC utilising one or more such stages.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which FIG. 1 schematically shows a pipeline ADC;

FIG. 3 shows a stage of a MDAC pipeline ADC not including a reset switch;

Figure 1:
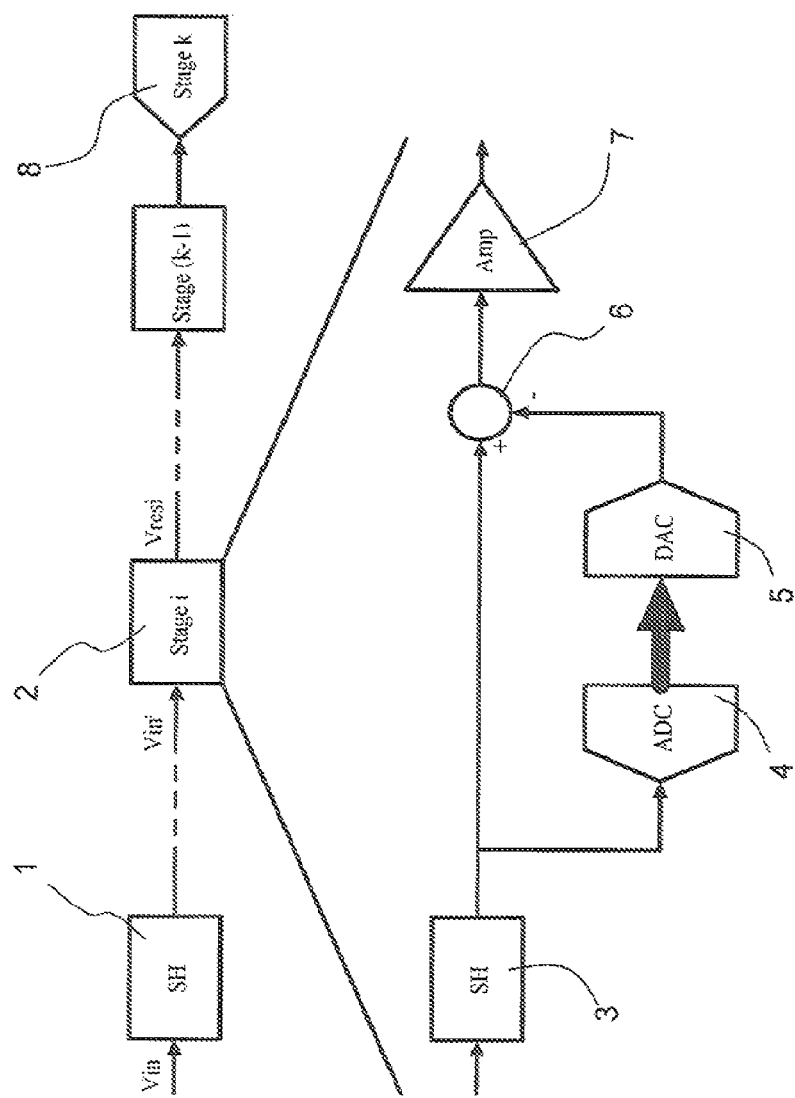

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Figure 4B:
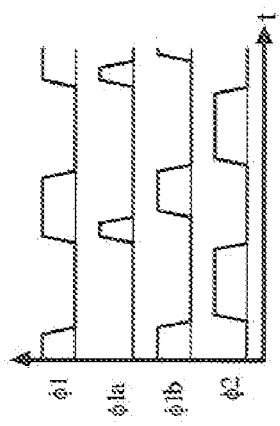
FIG. 4(b) shows the associated timing diagram of the switches.
Figure 4A:
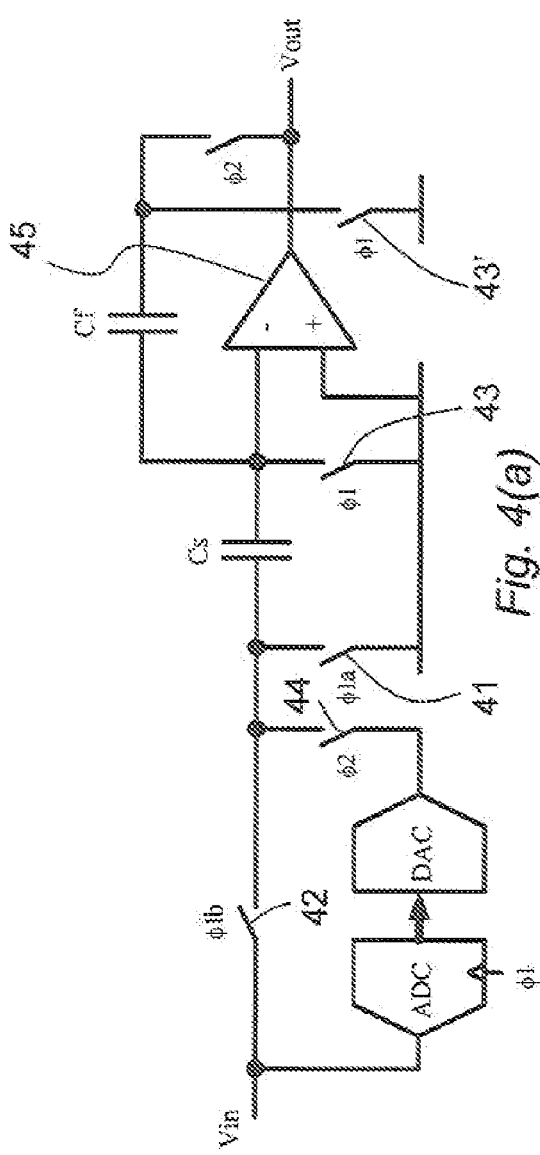
FIG. 4(a) shows a pipeline stage with a reset switch, according to an embodiment of the invention.

A first embodiment of the invention is illustrated in FIG. 4, which shows a single-ended switched capacitor ADC stage. This ADC stage is similar to a conventional ADC stage, except that there is included an extra switch 41, connected between the input electrode of sampling capacitor Cs and ground. In operation the sample period φ1 is split into two parts. During the first part of φ1, when φ1a is high, switch 41 is closed, and during the second part of φ1, when φ1b is high, switch 42 is closed and switch 41 is open again. Switch 41 comprises a reset switch, such that when it is closed, sampling capacitor Cs is discharged. At the same time, switches 43 and 43' are closed, to discharge the transfer capacitor Cf. After the reset time φ1a becomes low and φ1b becomes high connecting the sample capacitor Cs to the input. At the end of the sample period φ1 and φ1b go low and switch 42 is opened. The transition from high to low will happen slightly earlier for phase φ1 compared to φ1b to implement bottom-plate sampling. Also, switch 43 and 43' are opened, and switch 44 is closed, as φ2 goes high, in the same way as a conventional ADC stage.

Figure 5:
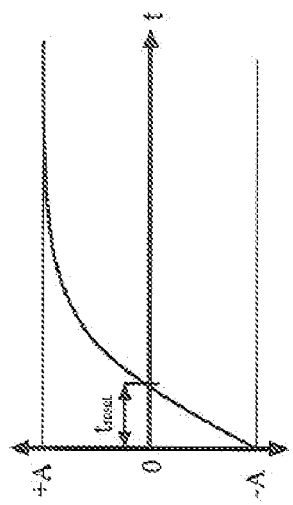
FIG. 5 illustrates the settling of the charging of a sampling capacitor.

The largest voltage step across the capacitor Cs from one sample to another sample is equal to the peak-to peak input voltage, assuming the capacitor charge is not reset. This sets the worst-case settle time. The settle behaviour will typically look as shown in FIG. 5. The optimal reset time is equal to the time $t_{reset}$ it takes to charge the sample capacitor from Vpeak to 0 during a peak-to peak input voltage transition. When capacitor Cs is discharged before $t_{reset}$ and tracking of the input starts again at $t_{reset}$ the settling requires the same amount of time as without the use of a reset time period. This holds under the assumption that the time it takes to turn on and off a switch is much shorter than the reset and sample time. For other input voltage transitions the settle time increases by using the optimal reset time. The settle time required though never exceeds the worst-case settle time. Since the circuit is dimensioned for the worst-case settle time scenario this does not degrade the performance.

As described above, the transfer capacitor Cf is discharged, by being connected to ground throughout the whole of period φ1, that is switch 43 is closed, throughout the time whilst φ1a is high (ie switch 41 is closed), and the time whilst φ1b is high and switch 42 is closed. It possible that the transfer capacitor Cf is discharged during only part of this period by opening switch 43' earlier, but this would complicate the timing and does not offer any particular advantage. Alternatively capacitor Cf could be discharged by placing switch 43' across it.

Figures 9A, 9B:
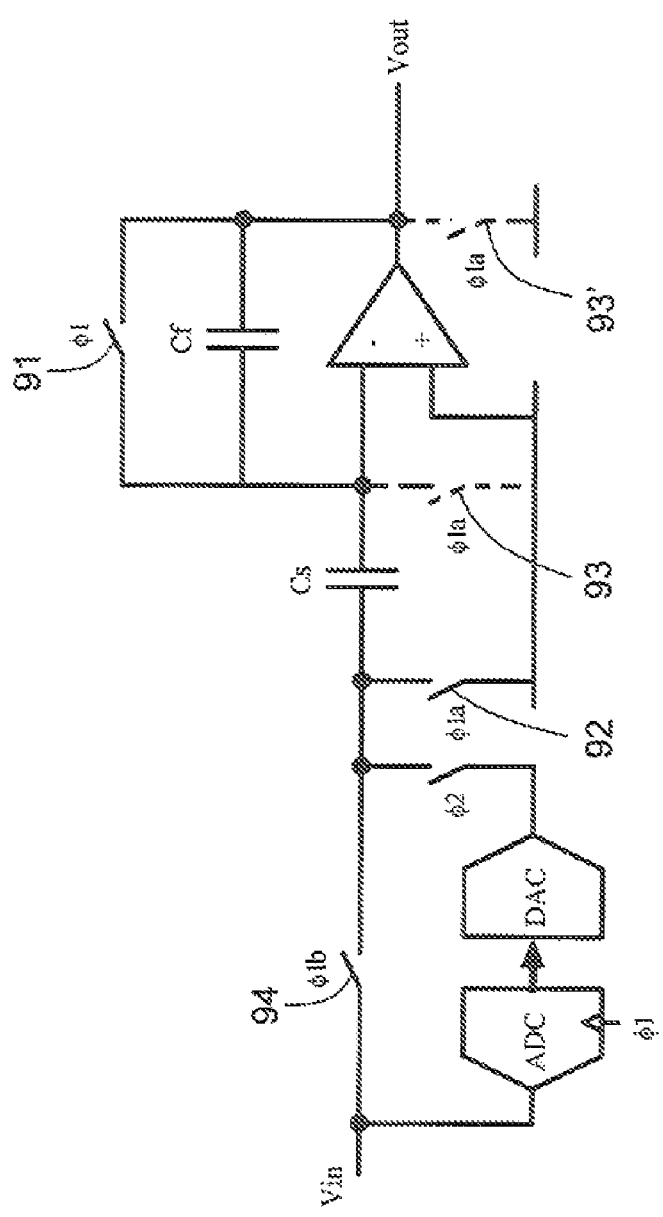
FIG. 9(a) shows an alternative embodiment to that shown in FIG. (4)
FIG. 9(b) shows the associated timing diagram.

An alternative embodiment of the invention, wherein the input signal is sampled with respect to a virtual ground, is shown in FIG. 9. During the time that φ1 is high, switch 91 is closed, transfer capacitance Cf is discharged. Because of the established feedback path, by closing switch 91, the opamp operates in unity gain mode and a virtual ground level is maintained at the negative input of the opamp. Switch 92 comprises a reset switch, such that when it is closed, sampling capacitor Cs is discharged. The current to discharge the sample capacitor must be delivered by the opamp. Switch 93 can be added to form a parallel path to speed up the discharging. Switch 93' can be added, in combination with switch 93, to speed up the discharging of the transfer capacitance Cf. After the reset time φ1a becomes low and φ1b becomes high connecting the sample capacitor Cs to the input. At the end of the sample period φ1 and φ1b go low and switches 91 and 94 are opened. It will be appreciated, though, that in this embodiment, during the sampling the opamp is active, to maintain virtual ground at the negative input, and thus contributes noise. Thus this embodiment is less preferred than that described above which benefits from bottom-plate sampling.

Figures 6A, 6B:
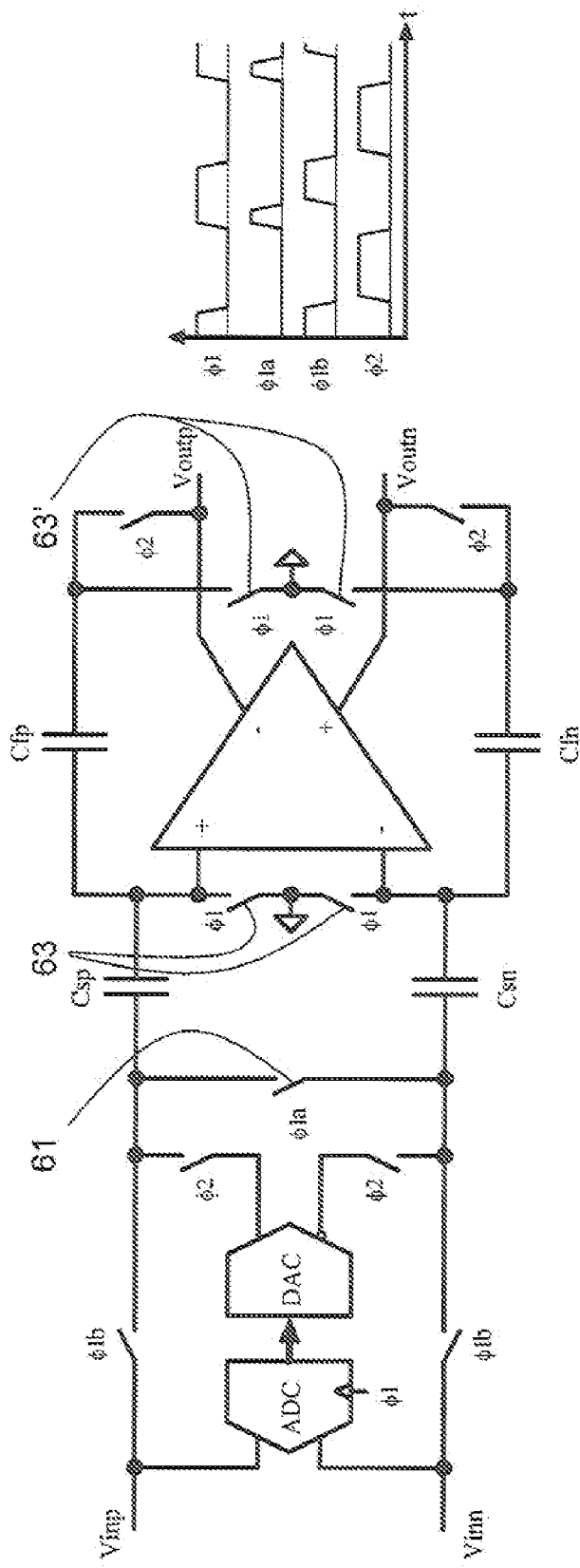
FIG. 6(a) shows a differential pipeline stage with a reset switch according to another embodiment of the invention.
FIG. 6(b) shows the associated timing diagram of the switches.

A further alternative embodiment of the invention is shown in FIG. 6. This embodiment allows the rejection of common disturbances by implementing a switched-capacitor stage differentially. Such differential operation of a switched-capacitor stage is frequently implemented, and as shown in FIG. 6, is entirely compatible with inclusion of a reset switch.

The charge on capacitors Csp and Csn have opposite polarity. To discharge these capacitors a reset switch 61 can be connected between the capacitors to allow redistribution of the charge during the reset time and thereby effectively resetting the voltages across the capacitors. The common charge on both capacitors is preserved in this way.

Figure 7:
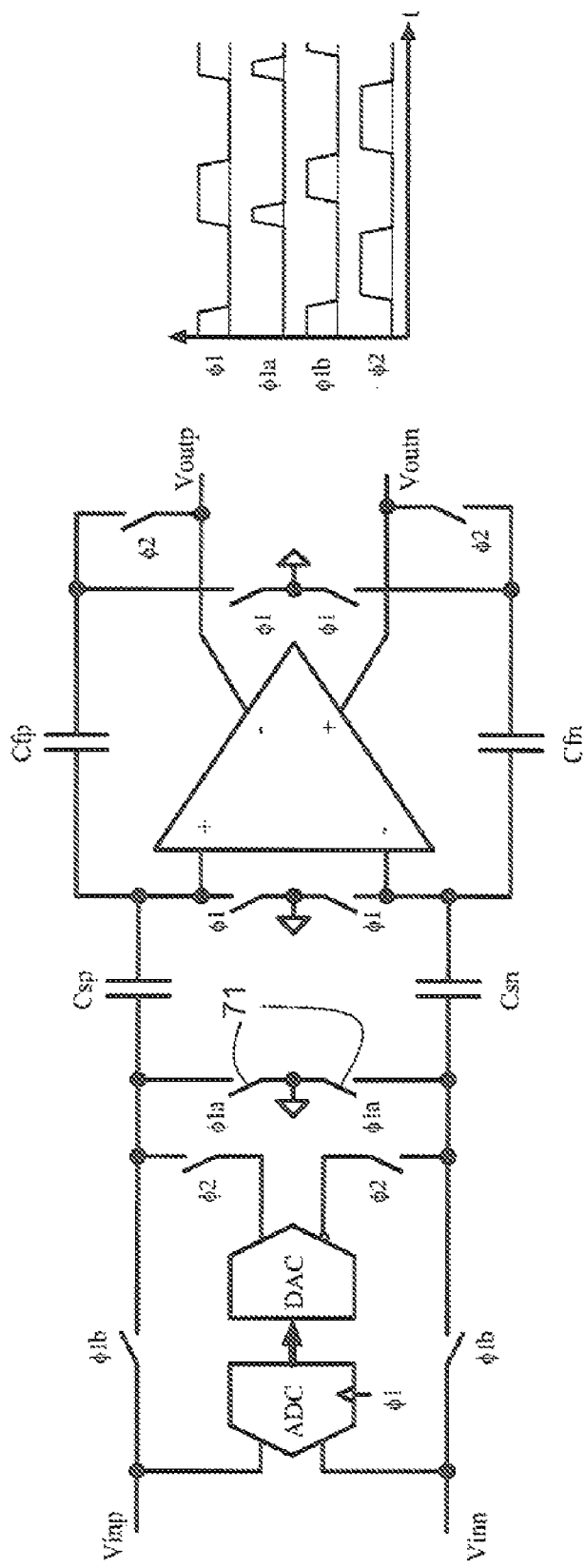
FIG. 7 shows a modification of the embodiment of FIG. 6, including grounding means for the sampling capacitors.

However, in a further alternative embodiment illustrated in FIG. 7, the reset switch 61 is replaced by a series-connected dual-through reset switch 71, with a common ground centre point. In this embodiment, when the reset switch 71 is closed during period φ1a, differential sampling capacitors Csp and Csn are both discharged to ground, rather than that the charge is being balanced therebetween. Since the embodiment of FIG. 6 already includes such dual-throw, centre-grounded switches 63 and 63', for grounding the differential inputs, and differential outputs of the opamp, no additional design complexity is introduced by the modification resulting in the embodiment of FIG. 7.

Figure 2A:
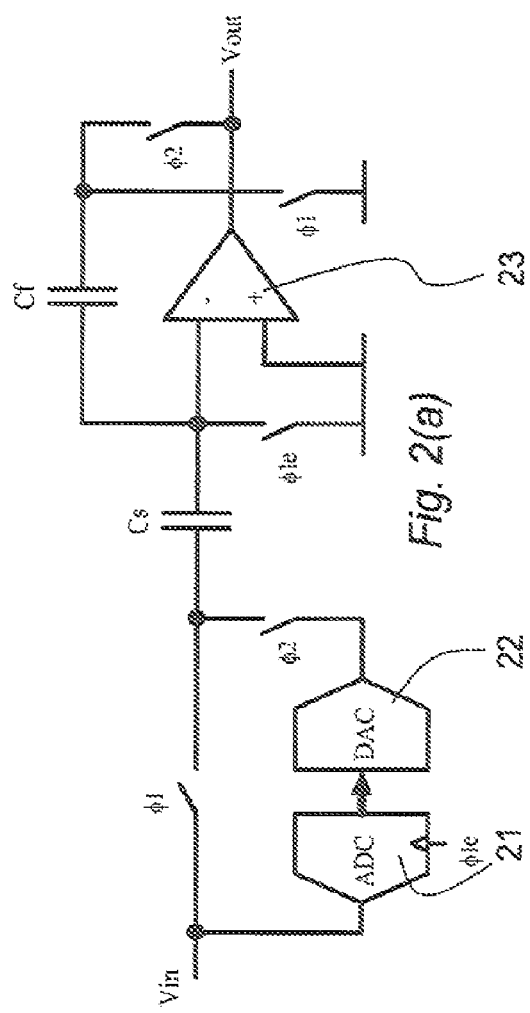
FIG. 2 is a schematic of a prior art individual stage of a pipeline ADC of FIG. 1.
Figure 2B:
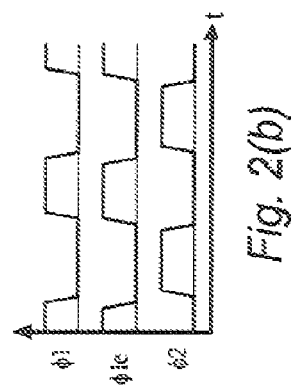

The DAC functionality in the basic architecture of the switched-capacitor pipeline stage shown in FIG. 2 as a separate block can be implemented with a switched-capacitor circuit. The DAC can share the same capacitor array already used for the sampling and subtraction action. This so called MDAC architecture ("multiplying digital-to-analog converter") of a switched-capacitor pipeline 2 stage is shown in FIG. 3—note that FIG. 3 does not include the reset switch. The ADC is not drawn explicitly in the figure. A N-bit ADC, with $L=2^N$ levels, is typically comprised of $K=L-2$ comparators. The output bits of the K comparators $D_1$ to $D_K$ are used to indicate the operation of the switches.

The ampersand symbol (&) represents logic AND and the exclamation mark (!) represents logic NOT. To implement the DAC functionality a two-level, externally provided, reference (+Vref, −Vref) is used and the sample capacitor Cs split-up into a number of unit capacitors. Depending on the comparator decisions a unit capacitor Cu=Cs/L is switched to either +Vref or −Vref when φ2 is high. Thereby an amount of charge is transferred to capacitor Cf1. This amount of charge $Q_\Delta$ is equal to Qq−KQu. The charge Qq is equal to:

$$Q_q = \frac{C_u}{L}D_1V_{ref} + \ldots + \frac{C_u}{L}D_KV_{ref} -$$
$$\frac{C_s}{L}!D_1V_{ref} - \ldots - \frac{C_s}{L}!D_KV_{ref}$$
$$= \frac{C_s}{L}(D_1 - !D_1 + \ldots + D_K - !D_K)$$
$$= \frac{C_u}{L}DV_{ref}$$

The charge Qu is $(Cs/L)V_{in}(t_s)$. The residue output voltage then becomes:

$$V_{out} = \frac{Q_{f1} - Q_\Delta}{C_{f1}} = \frac{L}{2}\left(V_{in}(t_s) - \frac{D}{L}V_{ref}\right)$$

The charge Qf1, sampled on capacitor Cf1, is $(2Cs/L)V_{in}(t_s)$. This transfer is equal to that of equation 1 when Cf therein is substituted by 2Cs/L. Capacitor Cf2 and the two switches connected to the bottom plate drawn dashed in FIG. 3 can be added to scale the output range [3]. The capacitor used to sample the input signal is now a distributed capacitor consisting out of K unit capacitors Cs/L and feedback capacitor Cf1. The next period when φ1 and φ1e are high again the distributed sample capacitor is connected to the input again to track the input and take a new sample on the falling edge of φ1e. The combined charge of the distributed sample capacitor at the start of the track period, and the voltage corresponding to this charge, is correlated to a previous input sample causing inter-symbol interference (ISI).

Figures 8A, 8B:
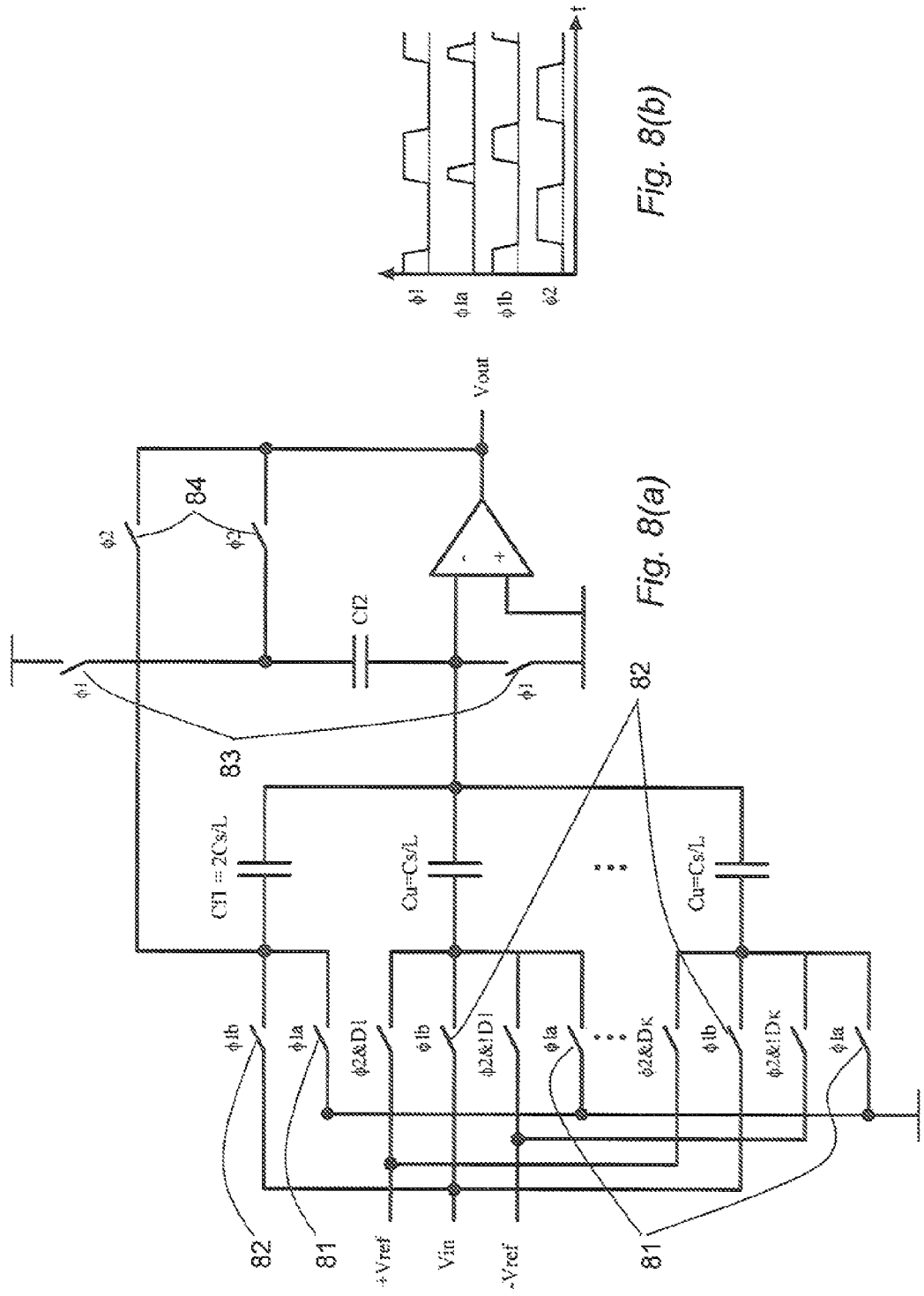
FIG. 8(a) shows a MDAC pipeline stage with a reset switch according to a further embodiment of the invention.
FIG. 8(b) shows the associated timing diagram of the switches.

A further embodiment of the invention, as applied to a multiplying DAC (MDAC), is illustrated in FIG. 8(a), and the associated timing diagram of the switches is shown in FIG. 8(b). This figure shows a single-ended implementation; however, it will be immediately apparent to the skilled person that the embodiment can readily and easily be adapted with no inventive skill, to the corresponding differential ADC stage.

The capacitor used to sample the input signal is now a distributed capacitor consisting out of K unit capacitors Cs/L and feedback capacitor Cf1, and is similar to the MDAC shown in FIG. 3 and described above. However, in this embodiment, each of these capacitors are to be discharged during the reset period φ1a. To discharge each capacitor a switch 81 is added as shown in FIG. 8(a). (For a differential implementation the switch can also be connected between each pair of differential capacitors as described above in relation to the non-multiplying DAC).

The timing diagram shown in FIG. 8(b) for this circuit is essentially the same as for the non-MDAC case, described above. That is, the sample period φ1 is split into two parts. During the first part of φ1, when φ1a is high, reset switch 81 is closed, and during the second part of φ1, when φ1b is high, switches 82 are closed and switches 81 opened. After the reset time φ1a becomes low and φ1b becomes high connecting sample capacitor Cs to the input. (As described above, sample capacitor Cs comprises, in this embodiment, a plurality of individual unit capacitors Cs/L). Switches 83 are closed and remain closed during at least part of the period φ1 is high, to discharge the transfer capacitor Cf2. At the end of the sample period φ1 and φ1b go low and switches 82 are opened. The transition from high to low will happen slightly earlier for phase φ1 compared to φ1b to implement bottom-plate sampling, as described above. Also, switches 83 are opened, and switches 84 are closed, as φ2 goes high, in the same way as a conventional ADC stage.

From reading the present disclosure, other variations and modifications will be apparent to the skilled person. Such variations and modifications may involve equivalent and other features which are already known in the art of pipeline ADCs and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A switched-capacitor pipeline ADC stage comprising an input stage comprising a quantizing ADC and a DAC,
a sampling capacitor having an input electrode which is switchably connectable to each of an input to the ADC stage and an output of the DAC, and
an output stage, connected to an output electrode of the sampling capacitor and for determining the difference between a signal at the DAC output and a signal at the ADC input,
characterized in that
the ADC stage further comprises a reset switch connected to the sampling capacitor and being for resetting the charge in the sampling capacitor, and is arranged to be closed, in use, for a predetermined period immediately prior to a connecting of the input electrode to the input to the quantizing ADC.

2. An ADC stage according to claim 1, wherein the output stage comprises transfer capacitance means connected between a first input of an operational amplifier and an output of the operational amplifier.

3. An ADC stage according to claim 2, wherein the transfer capacitance means is arranged to be discharged when the input electrode is connected to the input to the quantizing ADC.

4. An ADC stage according to claim 2, wherein the transfer capacitance means is arranged to be discharged when the reset switch is closed.

5. An ADC stage according to claim 1 comprising a MDAC stage wherein the sampling capacitor comprises a part of the transfer capacitance means, and the sampling capacitor comprises a plurality of individual capacitors having a common output electrode and each having an individual input electrode which input electrodes together comprise the input electrode, the individual input electrodes being individually switchably connectable to either one of two reference voltages, and being switchably connectable to the input to the ADC stage, and wherein the reset switch is arranged to be closed, in use, for the predetermined period immediately prior to the connecting of the individual input electrodes to the input to the quantizing ADC.

6. An ADC stage according to claim 5, wherein the two reference voltages are equal in magnitude and opposite in sign.

7. A switched-capacitor pipeline ADC stage comprising
an input stage comprising a quantizing ADC having differential inputs and a DAC having differential outputs,
first and second sampling capacitors each having a respective input electrode which is switchably connectable to a respective differential input to the ADC stage and the respective differential output of the DAC, and
an output stage, comprising a differential amplifier having differential inputs connected respectively to an output electrode of each of the first and second sampling capacitors,
characterized in that
the ADC stage further comprises a reset switch connected between the respective first and second sampling capacitors and being for balancing the charge between the sampling capacitors, and being arranged to be closed, in use, for a predetermined period immediately prior to connecting of the input electrodes to the respective differential input to the quantizing ADC.

8. An ADC stage according to claim 7, wherein the output stage comprises a first transfer capacitance means connected between a first input of an operational amplifier and an inverting output of the operational amplifier, and a second transfer capacitance means connected between a second input of the operational amplifier and a non-inverting output of the operational amplifier.

9. An ADC stage according to claim 8, wherein the transfer capacitance means are arranged such that respective charges on them are either discharged or made to balance when the input electrodes are connected to the respective differential input to the quantizing ADC.

10. An ADC stage according to claim 8, wherein the transfer capacitance means are arranged such that respective charges on them are either discharged or made to balance when the reset switch is closed.

11. An ADC stage according to claim 8, wherein the reset switch is arranged such that the respective input electrodes of the first and second sampling capacitors are connected to ground when the reset switch is closed.

12. An ADC stage according to claim 8 comprising an MDAC stage wherein the sampling capacitors comprise a part of the transfer capacitance means, and the each sampling capacitor comprises a plurality of individual capacitors having a common output electrode and each having an individual input electrode which input electrodes together comprise the respective sampling capacitor's input electrode, the individual input electrodes being individually switchably connectable to a reference voltage, and being switchably connectable to the respective input to the ADC stage and wherein the reset switch is arranged to be closed, in use, for the predetermined period immediately prior to the connecting of the individual input electrodes to the respective differential input to the quantizing ADC stage.

13. An ADC stage according to claim 7 wherein the differential outputs of the DAC have respective voltages which are equal in magnitude and opposite in sign.

* * * * *